United States Patent
Bores et al.

(10) Patent No.: US 6,520,338 B2
(45) Date of Patent: *Feb. 18, 2003

(54) WAFER CARRIER HAVING A LOW TOLERANCE BUILD-UP

(75) Inventors: Gregory W. Bores, Prior Lake, MN (US); Michael C. Zabka, Barron, WI (US)

(73) Assignee: Entegris, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/835,941

(22) Filed: Apr. 16, 2001

(65) Prior Publication Data

US 2002/0125169 A1 Sep. 12, 2002

Related U.S. Application Data

(63) Continuation-in-part of application No. 09/349,323, filed on Jul. 8, 1999, now Pat. No. 6,216,874.
(60) Provisional application No. 60/092,280, filed on Jul. 10, 1998.

(51) Int. Cl.$^7$ .......................... B65D 85/86; A47G 19/08
(52) U.S. Cl. ...................... 206/711; 206/454; 211/41.18
(58) Field of Search ................................ 206/710–712, 206/454, 832; 211/41.12, 41.18

(56) References Cited

U.S. PATENT DOCUMENTS

| 4,043,451 A | 8/1977 | Johnson |
|---|---|---|
| 4,061,228 A | 12/1977 | Johnson |
| 4,171,740 A | 10/1979 | Clement et al. |
| 4,557,382 A | 12/1985 | Johnson |
| 4,718,549 A | 1/1988 | Rissotti et al. |
| 4,747,488 A | 5/1988 | Kikuchi |
| 4,752,007 A | 6/1988 | Rossi et al. |
| 4,817,795 A | 4/1989 | Kos |
| 4,817,799 A | 4/1989 | Gregerson |
| 4,880,116 A | 11/1989 | Kos |
| 4,966,284 A | 10/1990 | Gregerson |
| 5,046,615 A | 9/1991 | Nentl et al. |
| 5,054,418 A | * 10/1991 | Thompson et al. ......... 206/454 |
| 5,207,324 A | 5/1993 | Kos |
| 5,273,159 A | 12/1993 | Gregerson |
| 5,476,176 A | * 12/1995 | Gregerson et al. .......... 206/711 |
| 5,755,332 A | * 5/1998 | Holliday et al. ............ 206/711 |
| 5,785,186 A | 7/1998 | Babbs et al. |
| 5,944,194 A | * 8/1999 | Gregerson et al. .......... 206/711 |
| 6,006,919 A | * 12/1999 | Betsuyaku .................. 206/711 |
| 6,010,008 A | * 1/2000 | Nyseth et al. .............. 206/711 |
| 6,010,009 A | * 1/2000 | Peterson et al. ............ 206/711 |
| 6,039,186 A | * 3/2000 | Bhatt et al. ................. 206/711 |
| 6,216,874 B1 | * 4/2001 | Bores et al. ................ 206/711 |

* cited by examiner

Primary Examiner—Bryon P. Gehman
(74) Attorney, Agent, or Firm—Patterson, Thuente, Skaar & Christensen

(57) ABSTRACT

A low tolerance build-up wafer carrier and method for assembling the same for supporting semiconductor wafer disks and for interfacing with processing equipment. Press-fit fasteners are used to assemble composite carriers and attach equipment interface portions to the carrier. Each press-fit fastener comprising a first fastener portion integral with a first element and a second fastener portion integral with a second element. The first and second fastener portions interferingly engaging each other when pressed together thereby connecting first and second elements without significant tolerance build-up. A further embodiment of the invention is to provide a wafer carrier having interface contact portions positioned to accept carrier contact portions, from processing equipment, through a guide plate or kinematic coupling. The interface contact portions acting to align the carrier and prevent tolerance build-up due to the flexing of the guide plate.

26 Claims, 8 Drawing Sheets

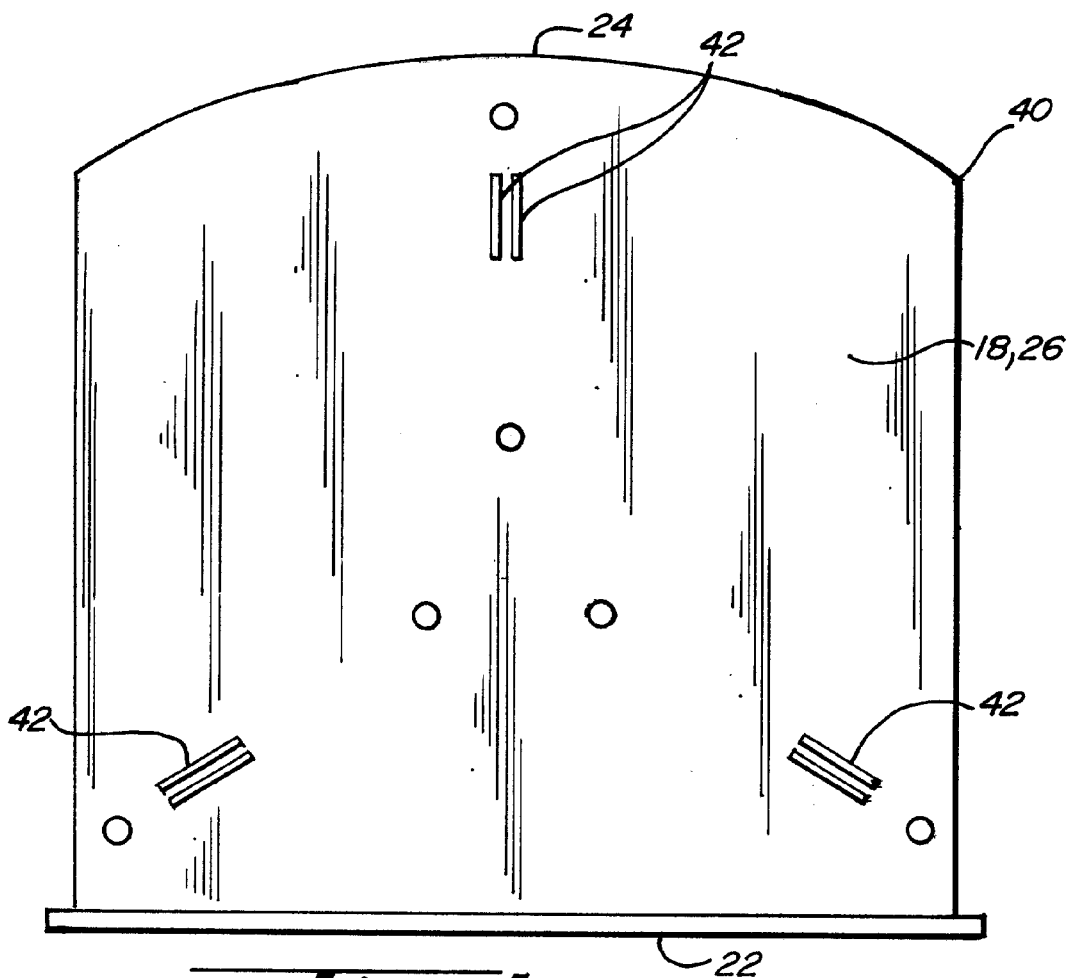
_Fig. 4._
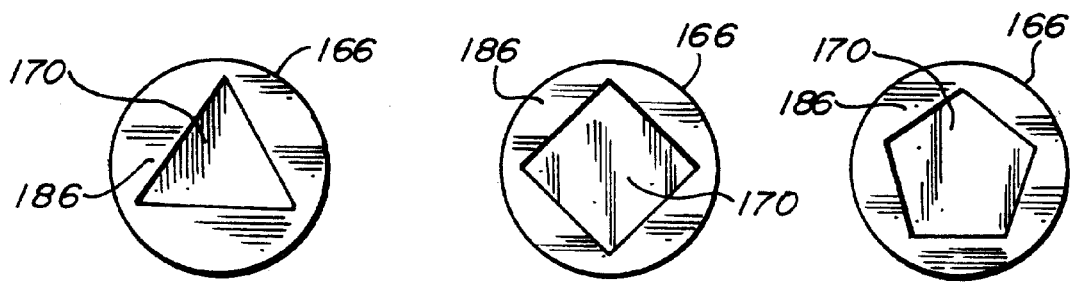
_Fig. 12a._  _Fig. 12b._  _Fig. 12c._
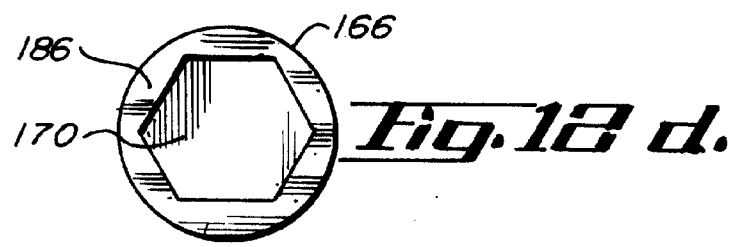
_Fig. 12d._

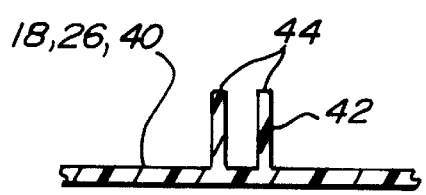
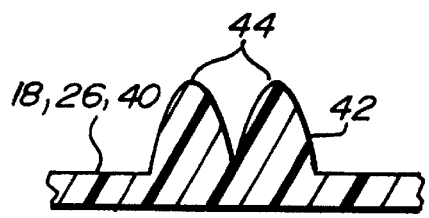
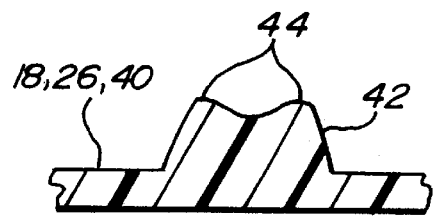
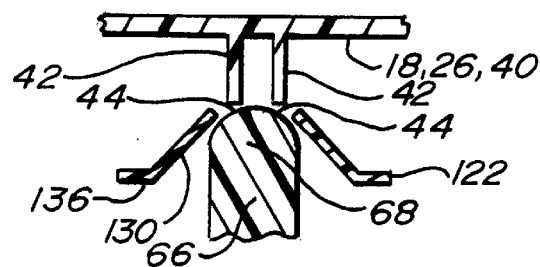
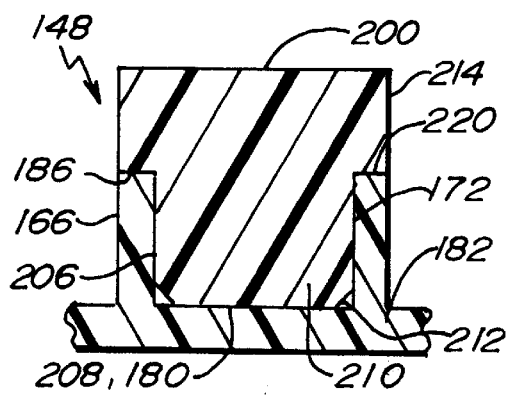
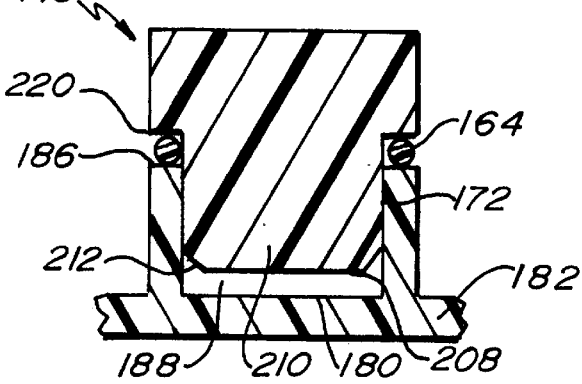
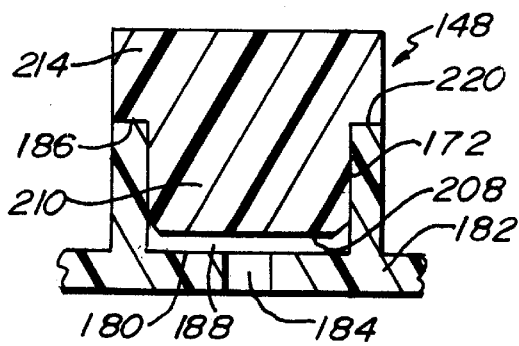

WAFER CARRIER HAVING A LOW TOLERANCE BUILD-UP

This is a continuation-in-part of U.S. patent application Ser. No. 09/349,323 filed Jul. 8, 1999, issuing Apr. 17, 2001 as U.S. Pat. No. 6,216,874, which claimed priority of Provisional Application No. 60/092,280 filed Jul. 10, 1998. This application also claims priority to said Provisional Application and incorporates the two applications by reference herein.

BACKGROUND OF THE INVENTION

The presented invention generally pertains to a wafer carrier designed for supporting, constraining, storing, and precisely positioning semiconductor wafer disks for use in the production of integrated circuits and a method for assembling the same. More specifically, the invention pertains to a low tolerance build-up wafer carrier that utilizes press-fit fasteners for connecting carrier components.

The transformation of wafer disks into integrated circuit chips often involves several steps where the disks are repeatedly processed, stored and transported. Due to the delicate nature of the disks and their extreme value, it is vital that they are properly protected throughout this procedure from contaminants. One purpose of a wafer carrier is to provide protection from these contaminants.

Since the processing of wafer disks is generally automated, it is essential for the carrier to precisely align the wafer disks according to the specifications of the processing equipment being used. The tolerances available to the carrier are generally very tight, around 0.20 inch, for proper interaction between the processing equipment and the wafer disks. The wafer carrier manufacturing industry constantly strives to design carriers with improved tolerances for better assurance of accurate carrier-equipment alignment.

Tolerance build-up or stacking often results when an aggregate of several parts is assembled. The resulting gap, grip, or interference is related to the dimensions and tolerances of the individual parts. The greater the tolerances of the individual parts the greater the likelihood that a gap or interference will result. Consequently, one must minimize the number of components used in order to minimize the tolerance build-up or stacking of these gaps and interferences.

Carriers may be of a single mold design or of a composite design made of several small individually molded parts. The problem of tolerance build-up clearly lies with the composite carrier due to the multiplicity of parts. In addition, composite carriers generally require fasteners to join the components introducing even more parts and further increasing tolerance build-up. Consequently, there is a need for a fastener for assembling composite wafer carriers that does not lead to tolerance build-up.

It is common to use screws to assemble composite wafer carriers. Problems exist with the use of these fasteners. First, over tightening the screws can lead to distortion of the carrier causing an increase in tolerance build-up. Second, it is time consuming to fasten components with screws. Consequently, there exists a need for a fastener that does not lead to distortion and can quickly fasten carrier components together.

Even though composite carriers are more susceptible to tolerance build-up than single mold carriers, single mold carriers still have their problems. Single mold carriers are more prone to warping than composite carriers due to the larger molds. Due to the difficulty in controlling the warping of single mold carriers and in predicting the extent to which the warping will affect the resulting product, it is often desirable to use the more predictable composite carrier design. By dividing up a single mold carrier into smaller, separately molded components, warping can be reduced and tight specifications can be met with greater consistency.

Generally, wafer carriers include an equipment interface portion, such as a guide plate or kinematic coupling, for properly orienting the carrier with respect to carrier interface portions provided by the processing equipment. Guide plates are often integrated into single mold carriers. Separating these equipment interfaces from the rest of the carrier design reduces the size of the molded parts, thus reducing the potential for warping. Consequently, there exists a need to have separate equipment interface portions that can be attached to single mold wafer carriers without tolerance build-up making it easier to meet critical carrier specifications.

Besides having a tendency to increase warping in single-mold carrier designs, equipment interfaces such as kinematic couplings are also susceptible to flexing when carrying the weight of the carrier. This flexing causes undesired shifting in the position of the carrier causing a tolerance build-up and increasing the potential for carrier-equipment mismatch. Consequently, there is a need for a carrier, capable of interfacing with processing equipment, that is not susceptible to the flexing of an attached kinematic coupling.

The present invention provides a wafer carrier and method for assembling the same for fulfilling the needs outlined above.

It is an object of the invention to reduce tolerance build-up by connecting carrier-related components with press-fit fasteners.

Another object of the invention is to provide interface contact portions on the carrier which directly contact the carrier interface portions for more accurate carrier-equipment alignment.

Still another object of the invention is to provide a carrier designed to avoid alignment problems associated with guide plates flexing under the weight of the carrier.

Another object of the invention is to attach a guide plate to the carrier with press-fit fasteners to reduce tolerance build-up.

Yet another object of the invention is to provide a composite wafer carrier having lower assembly costs.

Another object of the invention is to provide a method for assembling a composite wafer carrier with press-fit fasteners.

Still another object of the invention is to provide a fastener that can quickly attach carrier components together.

SUMMARY OF THE INVENTION

A wafer carrier interfaces with processing equipment or the like by way of an equipment interface portion which confronts a corresponding cooperating machine interface portion on processing equipment. In a preferred embodiment, cooperating machine interface portions are guided to pairs of interface contact portions positioned on the interface side of the carrier.

In another preferred embodiment, fasteners comprising a first portion integral with a first element and a second portion integral with a second element are used to attach the first and second elements together without tolerance build-up. These fasteners are used for assembling composite wafer carriers and for attaching equipment interfaces to carriers.

BRIEF DESCRIPTION OF THE DRAWINGS

FIG. 4 is a bottom elevational view of the interface side of a carrier.

FIG. 6 is a partial cross-sectional view of FIG. 5 along A—A with the carrier interface portion shown engaging the equipment interface portion.

FIG. 7a shows a partial, cross-sectional view of a preferred embodiment of the interface contact portions.

FIG. 7b shows a partial, cross-sectional view of a preferred embodiment of the interface contact portions.

FIG. 7c is a partial, cross-sectional view of a preferred embodiment of the interface contact portions.

FIG. 10a is a cross-sectional view of a fully engaged press-fit fastener according to one embodiment of the invention taken along the minimum axial bore diameter of the female fastener portion.

FIG. 10b is a cross-sectional view of a fully engaged press-fit fastener according to one embodiment of the invention taken along the minimum axial bore diameter of the female fastener portion.

FIG. 10c is a cross-sectional view of a fully engaged press-fit fastener according to one embodiment of the invention taken along the minimum axial bore diameter of the female fastener portion.

FIG. 12a depicts a female fastener portion having a triangular shaped aperture.

FIG. 12b depicts a female fastener portion having a square shaped aperture.

FIG. 12c depicts a female fastener portion having a pentagonal shaped aperture.

FIG. 2d depicts a female fastener portion having a hexagonal shaped aperture.

DETAILED SPECIFICATION

Figure 1:
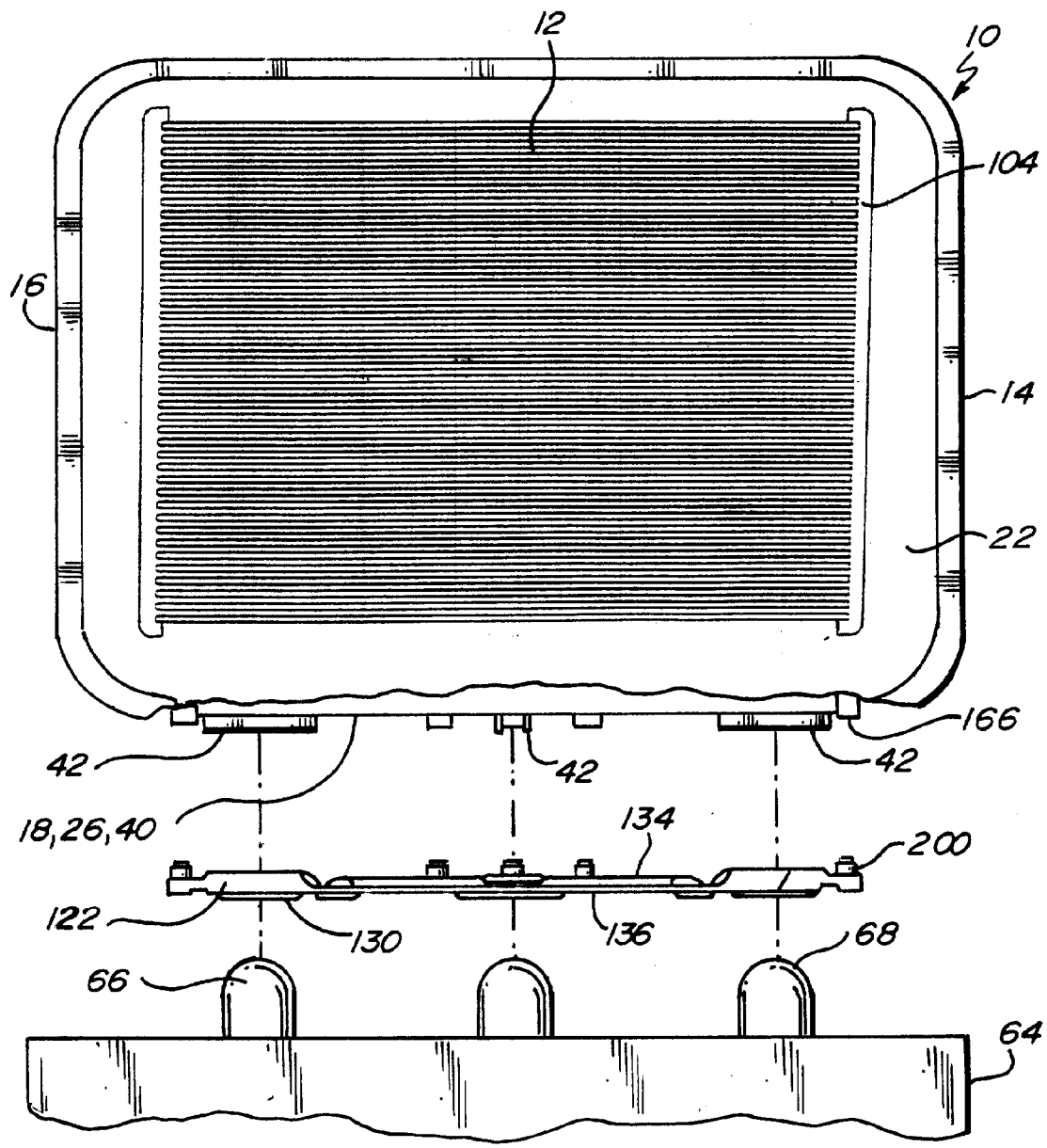
FIG. 1 is a partial sectional, exploded, elevational view of a wafer carrier having an attached guide plate engaging processing equipment.
Figure 2:
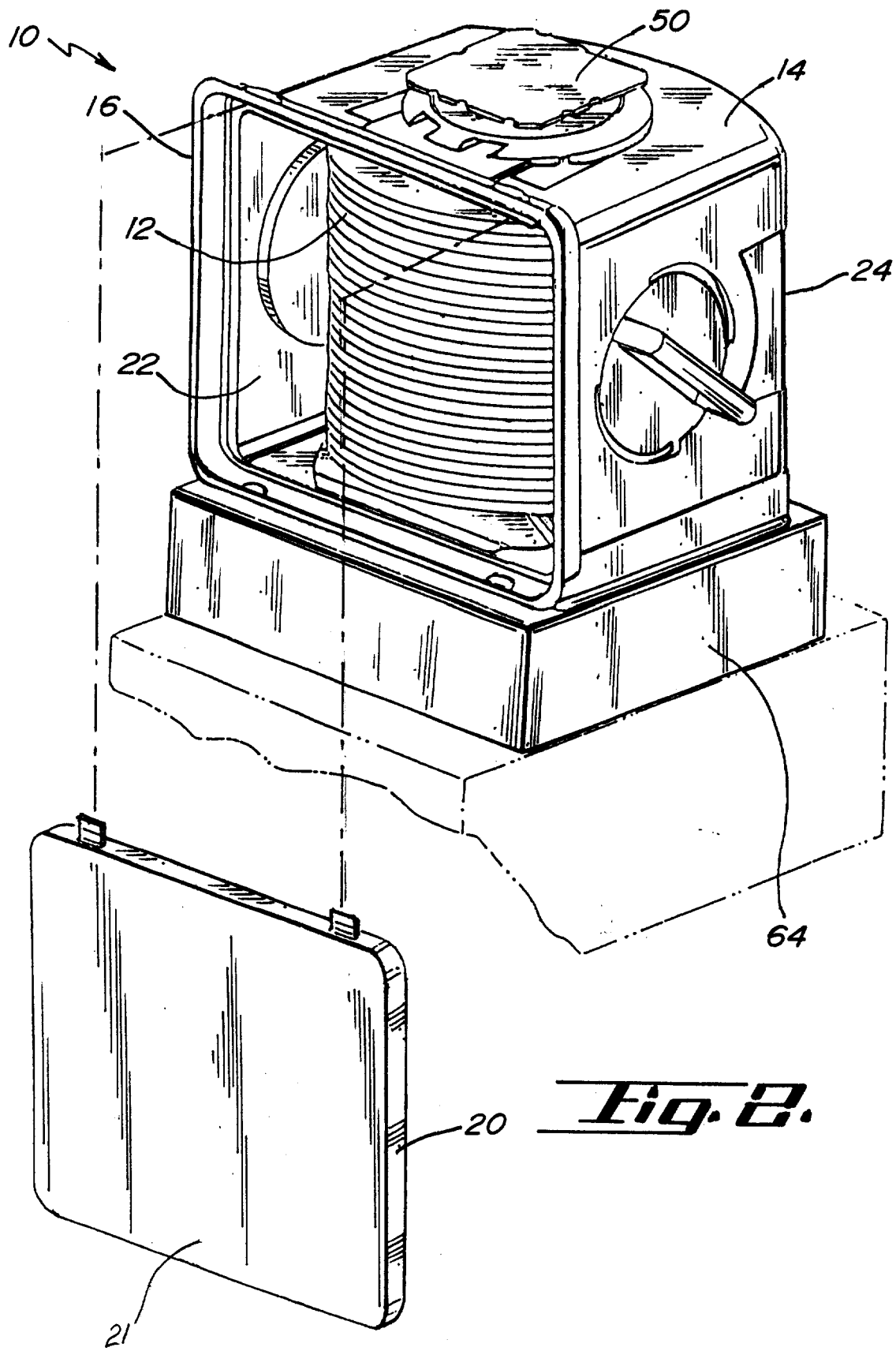
FIG. 2 is a perspective view of a wafer carrier engaged with processing equipment.

A wafer carrier or pod having a low tolerance build-up engaged with processing equipment, generally designated 10, is depicted in FIGS. 1 and 2. Wafer carrier or pod 14 having shell or housing portion 16 comprising bottom 26, front side 22 having an opening 23, and back side 24 opposite opening 23. Carrier 14 also having a pair of sidewalls 104 for supporting wafer disks 12 in a horizontal position. Door 20 is provided for closing opening 23 and sealing shell 16 to prevent contamination of disks 12. The door 20 has door components 21 such as panels or latch mechanisms.

Figure 5:
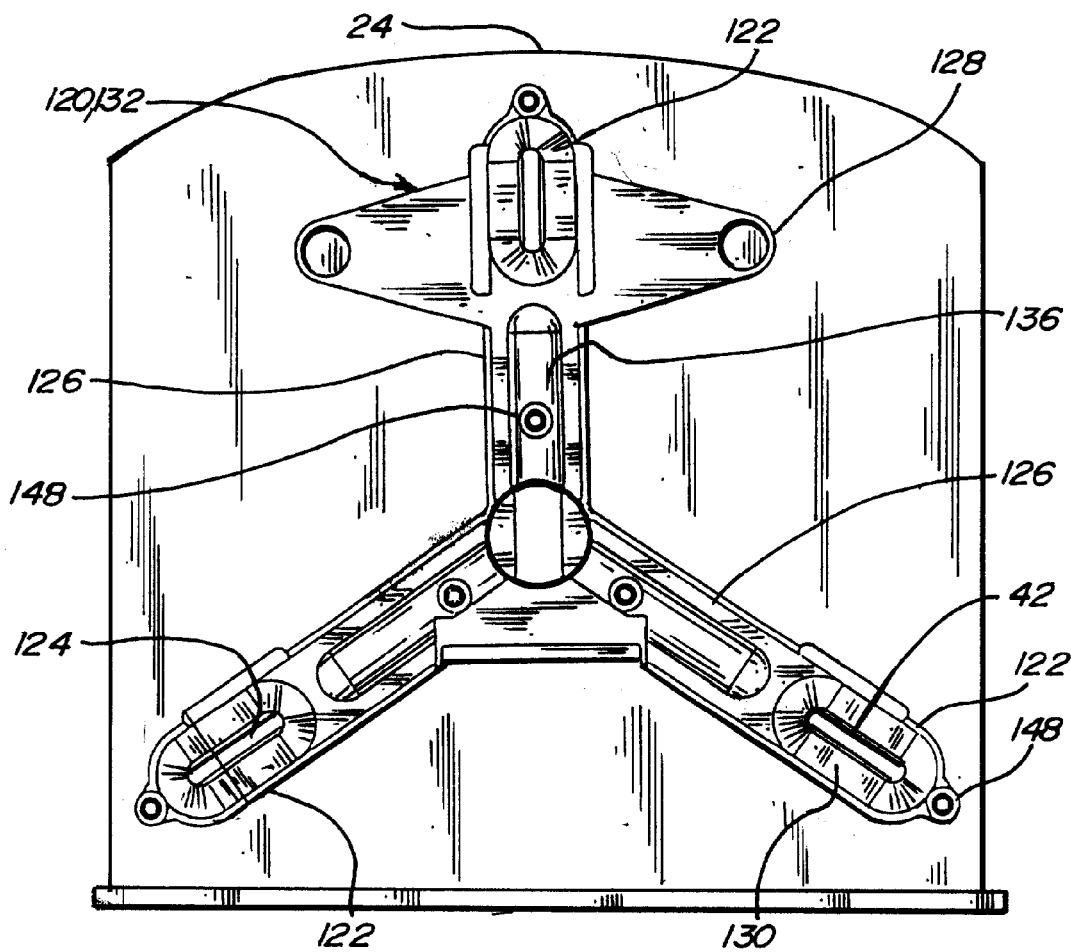
FIG. 5 is a bottom elevational view of the interface side of a carrier with attached guide plate.

Referring to FIGS. 1 and 4, equipment interface portion 40 is shown as being integral with interface side 18 of bottom 26. Interface side 18 facing equipment 64. Interface portion 40 having pairs of interface contact portions 42 shown as ribs which are positioned for interaction with corresponding guide plate or kinematic coupling 120 as shown in FIG. 5. Generally, interface portions 42 are positioned at the corners of an equilateral triangle. Female fastener portions 166 are shown in FIG. 4. These are for receiving corresponding male fastener portions 200 from guide plate 120 to facilitate attaching guide plate 120 to interface side 18 as shown in FIGS. 1 and 5.

It is possible for alternative arrangements of interface portions 42, and press-fit fastener portions 166 depending on the equipment to be interfaced. These alternative configurations may include more or fewer pairs of interface portions 42 and press-fit fastener portions 166. In addition, male fastener portions 200 and female fastener portions 166 may be interchanged in all embodiments of the invention.

Figure 3:
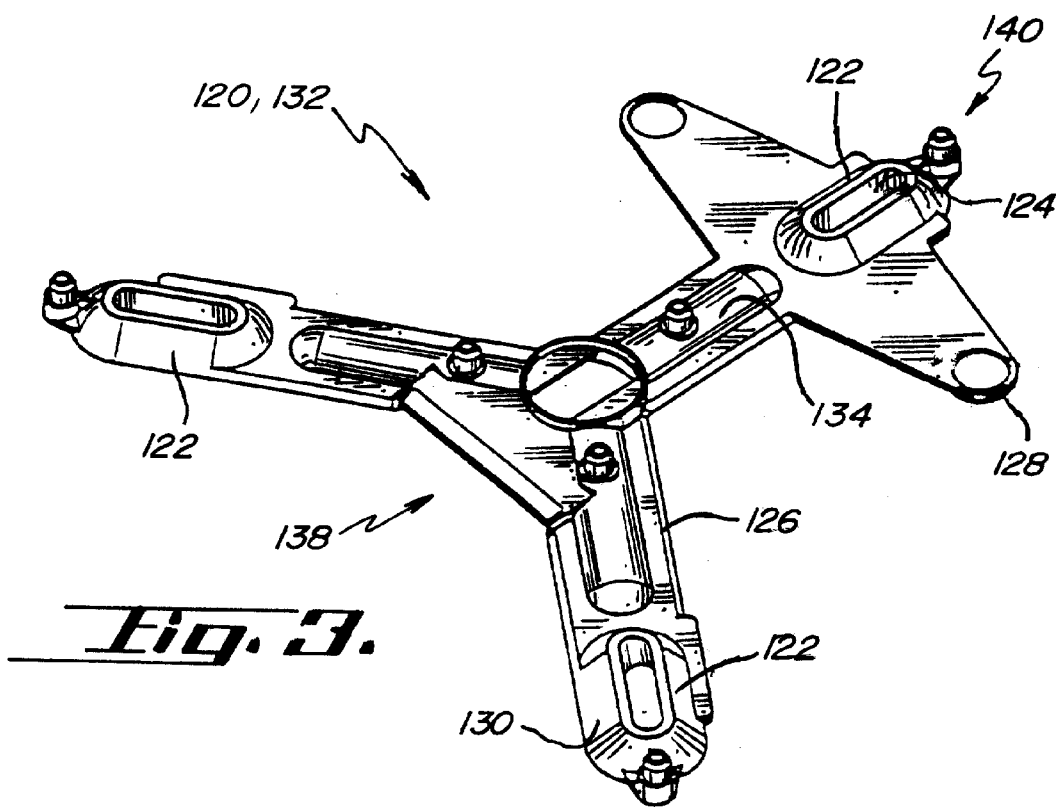
FIG. 3 is a perspective view of the carrier side of a guide plate.
Figure 12E:
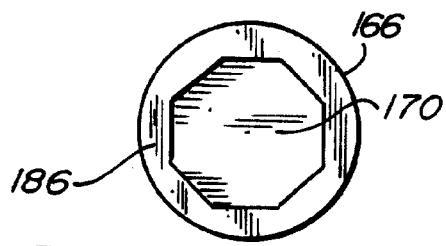
FIG. 12e depicts a female fastener portion having an octagonal shaped aperture.
Figure 12F:
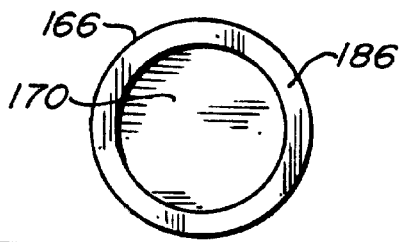
FIG. 12f depicts a female fastener portion having a spherical shaped aperture.
Figure 12G:
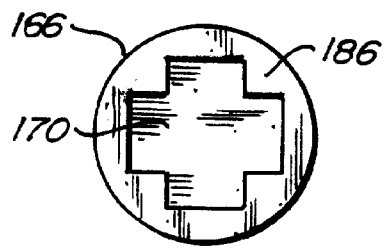
FIG. 12g depicts a female fastener portion having a cross-shaped aperture.
Figure 12H:
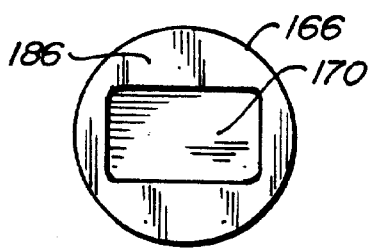
FIG. 12h depicts a female fastener portion having a rounded square shaped aperture.

Referring to FIGS. 3 and 4, guide plate 120 is shown having carrier side 134, equipment side 136, front side 138 corresponding with carrier front side 22, and back side 140 corresponding with carrier back side 24. Guide plate 120 comprising guide arms 126, sensor pads 128, press-fit fastener portions 200, and guide surfaces 130 having guide-in portions 122 and opening 124. Guide arms 126 are shown generally extending from the center of an equilateral triangle to the points of the triangle leaving an angle of 120 degrees between adjacent arms. This arrangement is generally used in the art.

The purpose of guide plate or kinematic coupling 120 is to guide carrier interface portions 66 along guide surfaces 130 to opening 124 for engagement with interface contact portions 42 at interface contact points 44 as shown in FIG. 6. Since carrier interface portions 66 are fixed with respect to processing equipment 64, guide plate 120 will orient carrier 14 into proper alignment with processing equipment 64. Flexing of guide arms 126 will not increase tolerance build-up due to direct contact between interface portions 42 and carrier interface portions 66.

FIGS. 7a through 7c show alternative embodiments of interface portions 42. FIG. 7a shows the use of ribs as interface portions 42. This configuration is preferred because their relatively small dimensions are not susceptible to significant warping. Other alternative embodiments of interface portions 42 are shown in FIGS. 7b and 7c. These utilize arches or humps to form the necessary contact points 44.

Figure 8:
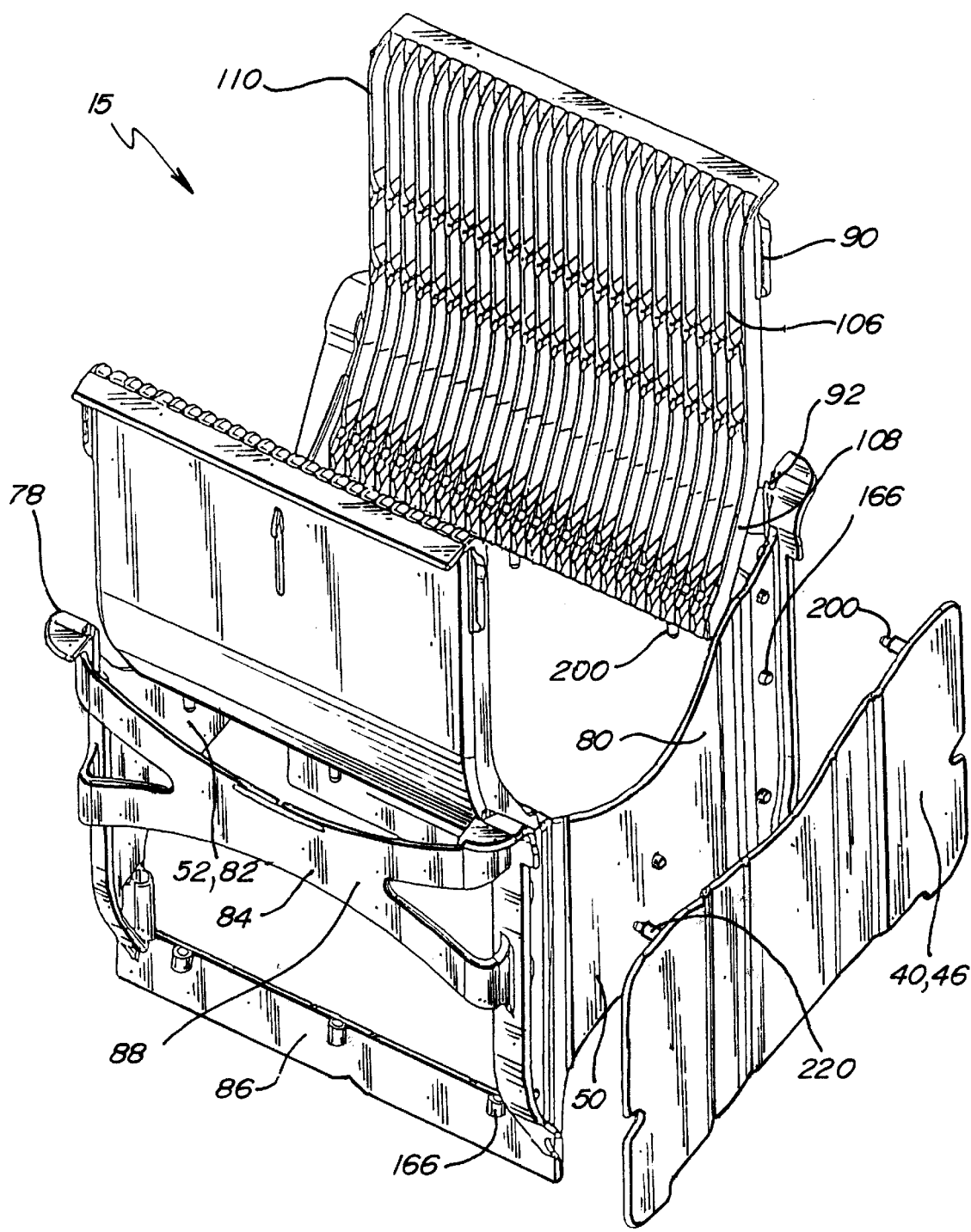
FIG. 8 is an exploded perspective view of a composite wafer carrier using press-fit fasteners to attach carrier components.

Referring now to FIG. 8, composite wafer carrier 15 is shown. Composite wafer carrier 15 comprising: carrier frame 78 having front end member 80, back end member 82, and opposing sidewall support members 84; sidewalls 104; and attachable equipment interface portion 40. Equipment interface portion 40 attached to front end member 80 with press-fit fasteners 148, where male fastener portions 200 are integral with equipment interface portion 40 and female fastener portions 166 are integral with front end member 80.

Equipment interface portion 40 and back end member 82 could take the form of an H-bar 52, robotic flange 50 or other machine interface for interfacing with equipment.

Continuing to refer to FIG. 8, sidewalls 104 have vertically aligned ribs 106 for supporting and constraining wafer disks 12, a concave lower portion 108, and a substantially vertical upper portion 110. Sidewalls 104 are attached to carrier frame 78 using press-fit fasteners 148, ribs 90, and grooves 92. Shown are male fastener portions 200 integral with lower portion 108 and ribs 90 integral with upper portion 110, which are inserted into corresponding female fastener portions 166 integral with bottom portions 86 and grooves 92 integral with top portions 88 to facilitate fastening of sidewalls 104 to carrier frame 78.

Figures 9, 11:
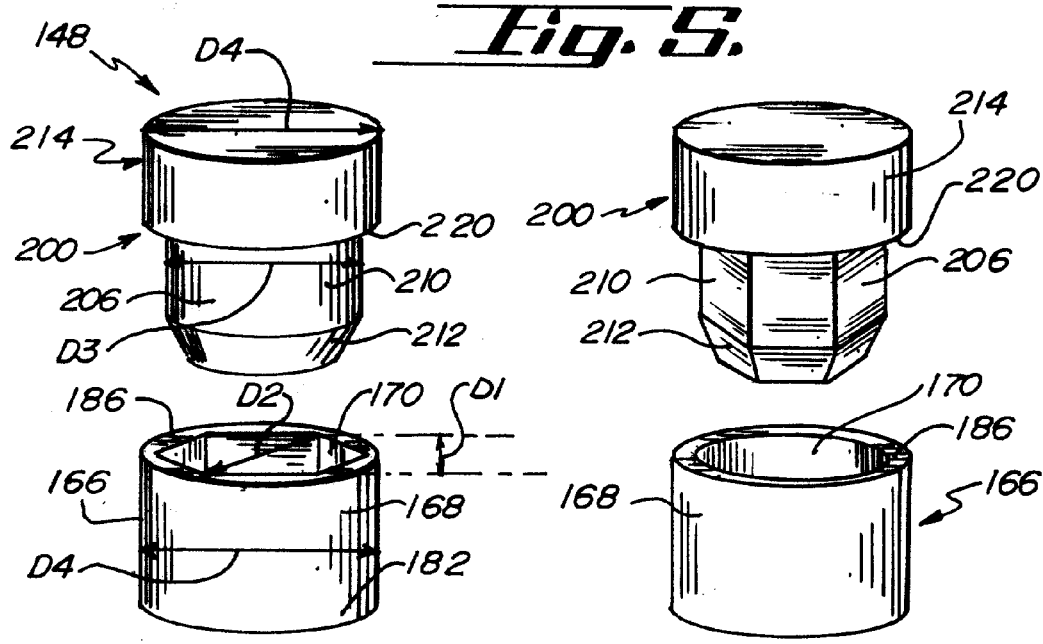
FIG. 9 is an exploded perspective view of a press-fit fastener according to one preferred embodiment.
FIG. 11 is an exploded perspective view of a press-fit fastener according to one preferred embodiment.

Referring now to FIG. 9, an embodiment of press-fit fastener 148 is shown. It is appropriate for fasteners 148 to be made of stiff plastic such as polycarbonate or PEEK. Each fastener 148 comprises female fastener portion 166 and male fastener portion 200. Female fastener 166 comprises body portion 168, polygonal-shaped bore 170, shoulder portion 186, and base portion 182. Polygonal-shaped bore 170 has a minimum bore diameter D1 and a maximum bore diameter D2. Male fastener portion 200 comprises base portion 214, shoulder portion 220, circular post 210 having surface 206 and diameter D3, and post end 212.

Base portions 182 and 214 are generally integral with the respective elements to be attached as shown in FIGS. 1, 4 and 8. An interference occurs when post 210 is pressed into bore 170 as shown in FIGS. 10a through 10c. Post surface 206 is distorted locking it into female fastener portion 166 from its interaction with bore surface 172 as a result of diameter D3 being less than diameter D2, but greater than diameter D1.

FIGS. 10a through 10c show different embodiments of complete press-fit fastener connections. In FIG. 10a, both shoulders 186 and 220 and end portions 108 and 208 engage to prevent further insertion of male fastener portion 200 and to seal off the press-fit fastener 148. FIG. 10b shows a press-fit fastener 148 using an o-ring 164 to form a seal between shoulders 186 and 220. A further embodiment is depicted in FIG. 10c where draining hole 184 is used to drain gap 188.

Another embodiment of press-fit fastener 148 is depicted in FIG. 11. Here, post 210 has a polygonal-shaped surface 206 and bore 170 is circular. This embodiment operates similarly to that shown in FIG. 9. Further embodiments of press-fit fastener 148 are provided in FIGS. 12a–12h which depict various shapes for bore 170 which can interferingly interact with surface 206 of circular shaped post 210 for fastening purposes.

Figure 13:
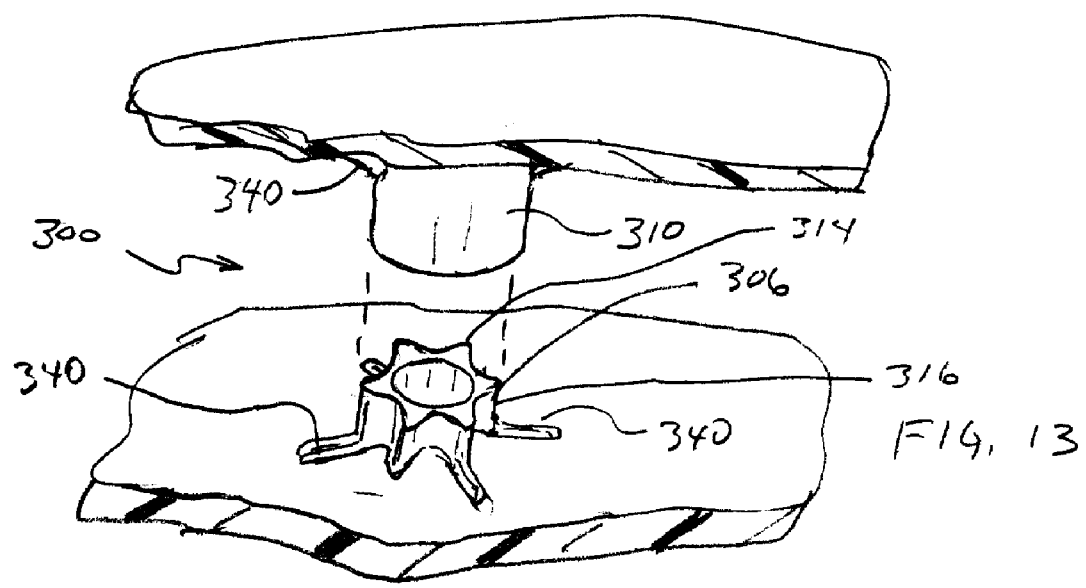
FIG. 13 is a perspective view of a pair of fastener portions.
Figure 14:
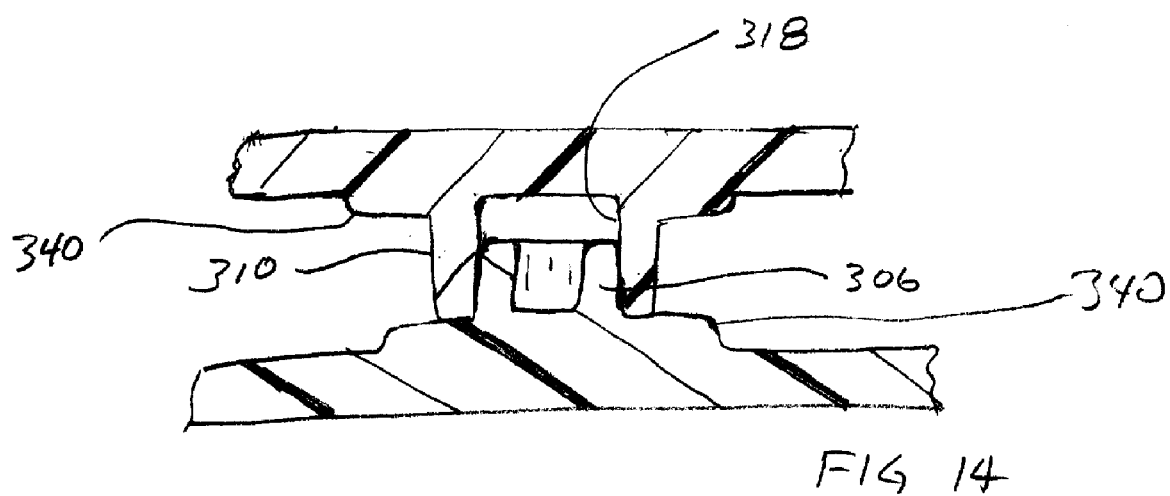
FIG. 14 is a cross-sectional view of the fastener portions of FIG. 13 engaged.

Referring to FIGS. 13 and 14, another embodiment of a press-fit fastener 300 suitable for use in plastic wafer carriers is illustrated. This fastener has a star-shaped post portion 306 and an extending circular post receiving portion 310. The star-shaped post portion has a plurality of points 312 each with an apex 314 providing a contact surface 316. The post receiving portion 310 is generally configured as a cylinder with a generally cylindrical bore 318. The bore may have a slight taper to provide a frustoconical bore to facilitate receiving and engaging the star-shaped post portion. Similarly the star-shaped post portion may also be slightly tapered for facilitating the connection. Both the post portion and the post receiving portion may have ribs 340 to provide structural support for the respective portion. A rib may also function as a stop for the cooperating portion as illustrated in FIG. 14.

Such fastener portions may be utilized for the guide plate as illustrated herein or for connection other components in wafer containers such as door components.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A wafer carrier for interfacing with equipment and supporting wafers in a precise location with respect to the equipment, the equipment having a carrier interface portion comprising three upwardly extending projections arranged in a triangle, the carrier comprising:

a) an interface side with an equipment interface portion comprising three pairs of interface contact portions integral with the interface side;

b) a guide plate adjacent the interface contact portions formed as a separate component from the interface side, and the guide plate fastened to the interface side of the carrier, the guide plate having three openings exposing the three pairs of interface contact portions whereby engagement of the carrier interface portions of the equipment with the interface contact portions of the interface side of the carrier aligns the carrier in precise location with the equipment for proper handling of the wafers; and c) a plurality of press-fit fasteners, each press-fit fastener having a first portion and a cooperating second portion, the first portion integral with the interface side and the second portion integral with the guide plate, whereby the first and second portions interferingly engage each other when pressed together thereby securing the guide plate to the interface side of the housing.

2. The carrier of claim 1, wherein one of said first and second portions of the press-fit fasteners are posts and y the other of said first and second portions are post receiving portions, each post receiving portion having an aperture for interferingly receiving the corresponding post.

3. The carrier of claim 2, wherein each post is star-shaped.

4. The carrier of claim 2, wherein each of the first and second portions of the press-fit fasteners further comprise reinforcing ribs integral for providing structural support to the respective portions.

5. The carrier of claim 1, wherein the carrier is an H-bar carrier.

6. The carrier of claim 1, wherein the carrier is a box for enclosing and supporting the wafers having an open front, the box further comprising a door for closing the open front.

7. The carrier of claim 1, wherein the carrier is a pod.

8. The carrier of claim 1, further comprising sidewalls for supporting the wafers, the sidewalls integral with the interface side.

9. A composite wafer carrier comprised principally of plastic for supporting and constraining wafer disks, the carrier comprising:

a first component, comprised principally of plastic; and a second component comprised principally of plastic attached to the first component with a plurality of press-fit fasteners, each of the press-fit fasteners comprising a first portion integral with the first component and a second portion integral with the second component, one of said first and second portions comprising a post receiving aperture and the other of said first and second portions comprising a star-shaped post sized to interferingly engage with the post receiving aperture, whereby the first portion and second portion may be pressed together thereby securing the first component to the second component.

10. The composite wafer carrier of claim 9, wherein the press-fit fasteners permanently connect the first component to the second component.

11. The composite wafer carrier of claim 9, wherein the post is integral with the first portion and the post receiving aperture has a circular opening.

12. The carrier of claim 9, wherein at least one of the first and second portions of the press-fit fasteners further comprise reinforcing ribs integral for providing structural support to the respective portion.

13. The composite wafer carrier of claim 9, wherein the second component is an equipment interface portion for presenting the carrier to equipment, thereby allowing the equipment to interface with the carrier and wafer disks.

14. The composite wafer carrier of claim 18, wherein the equipment interface is a kinematic coupling.

15. The composite wafer carrier of claim 9, wherein the first component is a door component.

16. The composite wafer carrier of claim 15, wherein the first component further comprises a carrier frame having a front end member, a back end member, two sidewall support members extending between the front and back end members, and a pair of sidewalls for supporting the wafer disks, each sidewall attached to one of the sidewall support members with a plurality of press-fit fasteners, each press-fit fastener comprising a first portion integral with one of the sidewalls and a second portion integral with one of the sidewall support members, whereby the first and second portions interferingly engage each other when pressed together thereby securing the sidewalls to the corresponding sidewall support member.

17. A composite wafer carrier comprised substantially of plastic for supporting and constraining wafer disks, the carrier comprising:
 a first component; and
 a second component attached to the first component with a plurality of press-fit fasteners formed of stiff plastic, each of the press-fit fasteners comprising a first portion integral with the first component and a second portion integral with the second component, one of said first and second portions comprising a post with a plurality of apexes said post having a first diameter and the other of said first and second portions comprising a post with a receiving region having a second diameter, said second diameter lesser than said first diameter, whereby the first and second fastener portions interferingly engage each other when pressed together thereby locking the first component to the second component.

18. The composite wafer carrier of claim 17, wherein the press-fit fasteners permanently connect the first component to the second component.

19. The composite wafer carrier of claim 17, wherein the second component is an equipment interface portion for presenting the carrier to equipment, thereby allowing the equipment to interface with the carrier and wafer disks.

20. The composite wafer carrier of claim 19, wherein the equipment interface is a robotic flange.

21. The composite wafer carrier of claim 19, wherein the equipment interface is an H-bar.

22. The composite wafer carrier of claim 19, wherein the equipment interface is a kinematic coupling.

23. The composite wafer carrier of claim 17, wherein the post is star-shaped and the equipment interface is a machine interface.

24. A method for assembling a composite wafer carrier, comprising the steps of:
 providing a first carrier component comprised principally of plastic, for supporting wafer disks, the first carrier component having a first press-fit fastener portion;
 providing a second carrier component comprised principally of plastic having a second press-fit fastener portion, one of the first and second fastener portions comprising a post with a star-shape, the other of said first and second fastening portions comprising a post receiving recess, the second press-fit fastening portions adapted to interferingly engage the first press-fit fastening portion for attachment purposes;
 aligning the corresponding first and second press-fit fastening portions; and
 pressing the first and second fastening portions together, thereby locking the first and second carrier components together.

25. The method for assembling a composite wafer carrier of claim 24, wherein the second carrier component is an equipment interface portion for presenting the carrier to equipment, thereby allowing the equipment to interact with the carrier and wafer disks.

26. The method of claim 25, further comprising the step of selecting a kinematic coupling for the equipment interface portion.

* * * * *